(12) United States Patent
Purgill et al.

(10) Patent No.: US 6,252,404 B1
(45) Date of Patent: Jun. 26, 2001

(54) REDUCED NOISE RF COIL APPARATUS FOR MR IMAGING SYSTEM

(75) Inventors: Dewain A. Purgill, Waukesha; Michael J. Radziun, Waterford; David E. Dean, Hartland, all of WI (US)

(73) Assignee: General Electric Company, Waukesha, WI (US)

( * ) Notice: Subject to any disclaimer, the term of this patent is extended or adjusted under 35 U.S.C. 154(b) by 0 days.

(21) Appl. No.: 09/376,543

(22) Filed: Aug. 18, 1999

(51) Int. Cl.[7] ....................................... G01V 3/00
(52) U.S. Cl. ........................... 324/318; 324/322
(58) Field of Search ..................... 324/318, 322, 324/300, 306, 307, 309

(56) References Cited

U.S. PATENT DOCUMENTS

| | | | |
|---|---|---|---|
| 4,639,672 | * | 1/1987 | Beaumont ............................. 324/318 |
| 4,652,824 | * | 3/1987 | Oppelt .................................. 324/318 |
| 5,457,387 | * | 10/1995 | Patrick et al. ........................ 324/318 |

* cited by examiner

Primary Examiner—Louis Arana
(74) Attorney, Agent, or Firm—Jenkens & Gilchrist

(57) ABSTRACT

In an MR imaging system provided with a main magnet having a bore and with a gradient coil assembly located within the bore, RF coil apparatus is provided for reducing noise in the imaging volume of the MR system. The RF coil apparatus comprises a tubular RF coil form provided with an inner surface, an RF coil attached to the inner surface of the RF coil form, and mounting structure extending between the RF coil form and gradient coil assembly. The mounting structure supports the RF coil and RF coil form upon the gradient coil assembly, in spaced-apart relationship therewith. The apparatus further compises an inner tubular member which is selectively constructed to oppose transmission of acoustic signals from the RF coil to the imaging volume. The inner tubular member is fixably supported within the main magnet bore so as to be in selected spaced-apart relationship with the RF coil and RF coil form, the inner tubular member substantially enclosing a specified portion of the volume of the bore, which comprises the MR system imaging volume.

17 Claims, 3 Drawing Sheets

REDUCED NOISE RF COIL APPARATUS FOR MR IMAGING SYSTEM

BACKGROUND OF THE INVENTION

The invention disclosed and claimed herein generally pertains to an RF coil arrangement for a magnetic resonance (MR) imaging system or scanner. More particularly, the invention pertains to an arrangement wherein the RF coil of the MR scanner is selectively mounted in relation to other components of the scanner, to substantially reduce the noise or acoustic disturbance which is experienced by a patient located within the bore of the scanner, that is, within the MR imaging volume.

As is well known, an MR imaging system or scanner commonly includes a cryostat, which contains a powerful superconductive main magnet positioned around a main magnet bore. The superconductive magnet is maintained at an extremely cold temperature and produces a strong static magnetic field, or $B_0$ field, within the bore, the $B_0$ field being directed along the bore axis. Other essential components of the MR system include the RF coil, or RF antenna, and the gradient coil assembly, which comprises a hollow cylindrical structure. The RF coil may be operated in a transmit mode, to generate MR signals in an imaging subject, or may be operated in a receive mode to detect the MR signals. The gradient coil assembly comprises one or more cylindrical coil forms, as well as a set of gradient coils supported thereby, to produce the X-, Y-, and Z-gradient magnetic fields. These fields are required to spatially encode MR data. Typically, the gradient coil assembly is positioned within the main magnet bore.

In the past, it has been common practice to support the RF coil within the main magnet bore by attaching it to a further essential MR system component comprising an inner cylindrical form. The inner form comprises a tubular member which is inserted through the gradient coil assembly, in coaxial relationship therewith. The interior region of the inner tubular member generally comprises the patient bore or imaging volume of the associated MR system, that is, the volume which is disposed to receive a patient, and in which MR signals are generated and detected. The ends of the inner tubular member are attached to the cryostat, by means of end caps or the like, so that the tubular member is supported thereby. Typically, the RF coil is placed around the outside diameter of the inner tubular member, in close adjacent relationship, and supported or carried thereby. The tubular member is made of a non-electrically conductive material, so that it does not impede RF performance within the imaging volume.

Prior art arrangements of the above type and components thereof are described, for example, in U.S. Pat. Nos. 5,570,021 and 5,760,584, both commonly assigned herewith to the General Electric Company. Two of the inventors named in U.S. Pat. No. 5,570,021 are coinventors herein. In such arrangements, the RF coil is supportably mounted on the inner form or tubular member, as a convenient technique for providing an essential spacing between the RF coil and the gradient coil assembly. However, an MR imaging system employs electrically excited gradient coils to impose time varying magnetic fields on the primary or $B_0$ magnetic field. These time varying fields tend to induce eddy currents in the conductors of the RF coil, which in turn may cause mechanical motion of the RF coil. In the prior art arrangement described above, the inventors have recognized that such mechanical motion may be a principal reason for the occurrence of noise within the imaging volume. More specifically, the inventors have recognized that if the RF coil is joined to and supported upon the inner tubular member, the eddy current induced motion of the RF coil may drive the tubular member in the manner of an acoustic loudspeaker. The inner tubular member thus serves as a noise generator within the imaging volume. In the past, those of skill in the art tended to overlook RF coil motion as a major source of noise. It is likely that this occurred because the quality of MR images, acquired in the presence of RF coil motion caused by the induced eddy currents, did not seem to be adversely affected by such motion.

SUMMARY OF THE INVENTION

The invention is generally directed to RF coil apparatus for an MR imaging system, which is intended to substantially reduce noise or acoustic disturbance in the associated patient imaging volume of the MR system. The RF coil apparatus comprises a tubular RF coil form provided with a cylindrical inner surface, and further comprises an RF coil which is selectively attached to the RF coil form, in adjacent relationship with the inner surface. A mounting structure extends between the RF coil form and the inner wall of the MR system gradient coil assembly, in order to support the RF coil and the RF coil form upon the gradient coil assembly. The RF coil apparatus of the invention further comprises an inner tubular member. Means are provided for fixably supporting the inner tubular member within the bore of the MR system main magnet, in selected spaced-apart relationship with the RF coil and the RF coil form. The supported inner tubular member defines a specified portion of the main magnet bore as the MR imaging volume. The inner tubular member also serves to provide an acoustic barrier between the RF coil and the imaging volume.

In a preferred embodiment, the mounting structure is disposed to support the RF coil and the RF coil form in selected spaced-apart relationship with the inner wall of the gradient coil assembly. Preferably, the mounting structure comprises a sleeve member which is joined to the inner wall of the gradient coil assembly, and a plurality of adjustable screws which extend between the sleeve member and the RF coil form. At each end of the RF coil form, three of the adjustable screws are positioned around an annular space located between the sleeve member and the RF coil form, in substantially equidistant relationship with one another.

DETAILED DESCRIPTION OF THE PREFERRED EMBODIMENT

Figure 1:
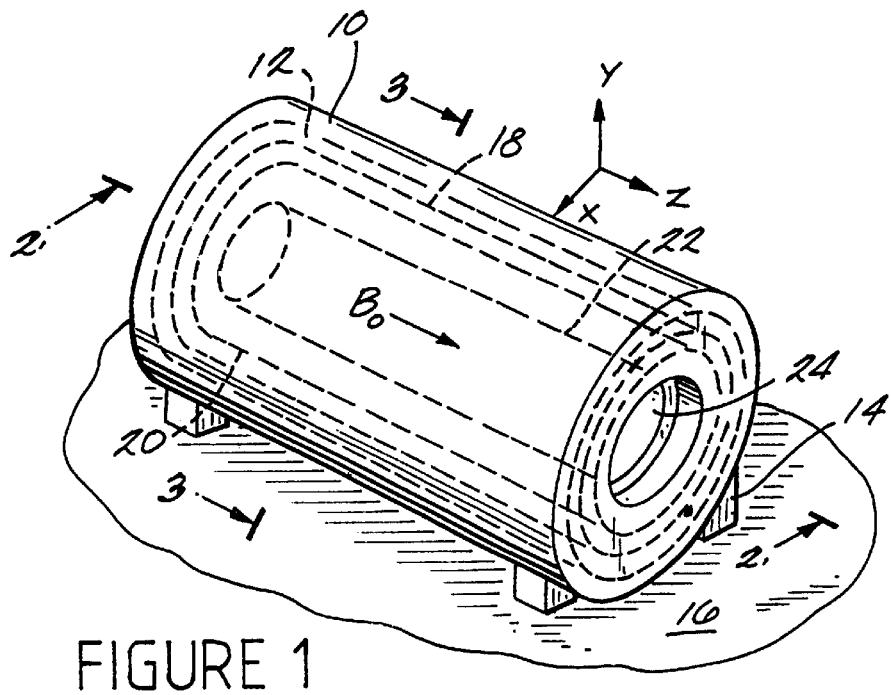
FIG. 1 is a simplified perspective view depicting certain components of an MR system which are associated with an embodiment of the invention.

Referring to FIG. 1, there is shown a cryostat and main magnet arrangement 10, of a type which is commonly used in connection with MR high field imaging systems. As is well known by those of skill in the art, the main magnet is positioned around a bore 12 and is contained or enclosed within the cryostat. The cryostat maintains the main magnet at an extremely low temperature. Thus, the main magnet is in a superconductive state, to produce a strong, static $B_0$ magnetic field as required for MR imaging. For brevity, cryostat and main magnet arrangement 10 are hereinafter referred to as main magnet 10. Metal legs 14 are provided to support the main magnet 10 on a floor 16, when the main magnet and other components of an MR imaging system (not shown) are set up for use.

Bore 12 of main magnet 10 is disposed to receive a gradient coil assembly 18, comprising a hollow cylindrical structure. As is well known, gradient coil assembly 18 contains coils (not shown) for generating respective X-, Y-, and Z-gradient fields within the main magnet bore, as are required for MR imaging. The gradient fields are respectively oriented relative to X-, Y-, and Z- coordinate axes, wherein the Z-axis is aligned along the axis of the main magnet bore, in parallel relationship with the direction of the $B_0$ magnetic field.

Referring further to FIG. 1, there is shown an RF coil assembly 20, described hereinafter in further detail, which likewise comprises a hollow cylindrical structure. RF coil assembly 20 has an outside diameter which is selectively less than the inside diameter of gradient coil assembly 18, and is positioned within the gradient coil assembly, in spaced-apart coaxial relationship therewith. RF coil assembly 20 includes an RF coil or antenna for transmitting and/or receiving RF signals, as required for the MR imaging process.

Figure 2:
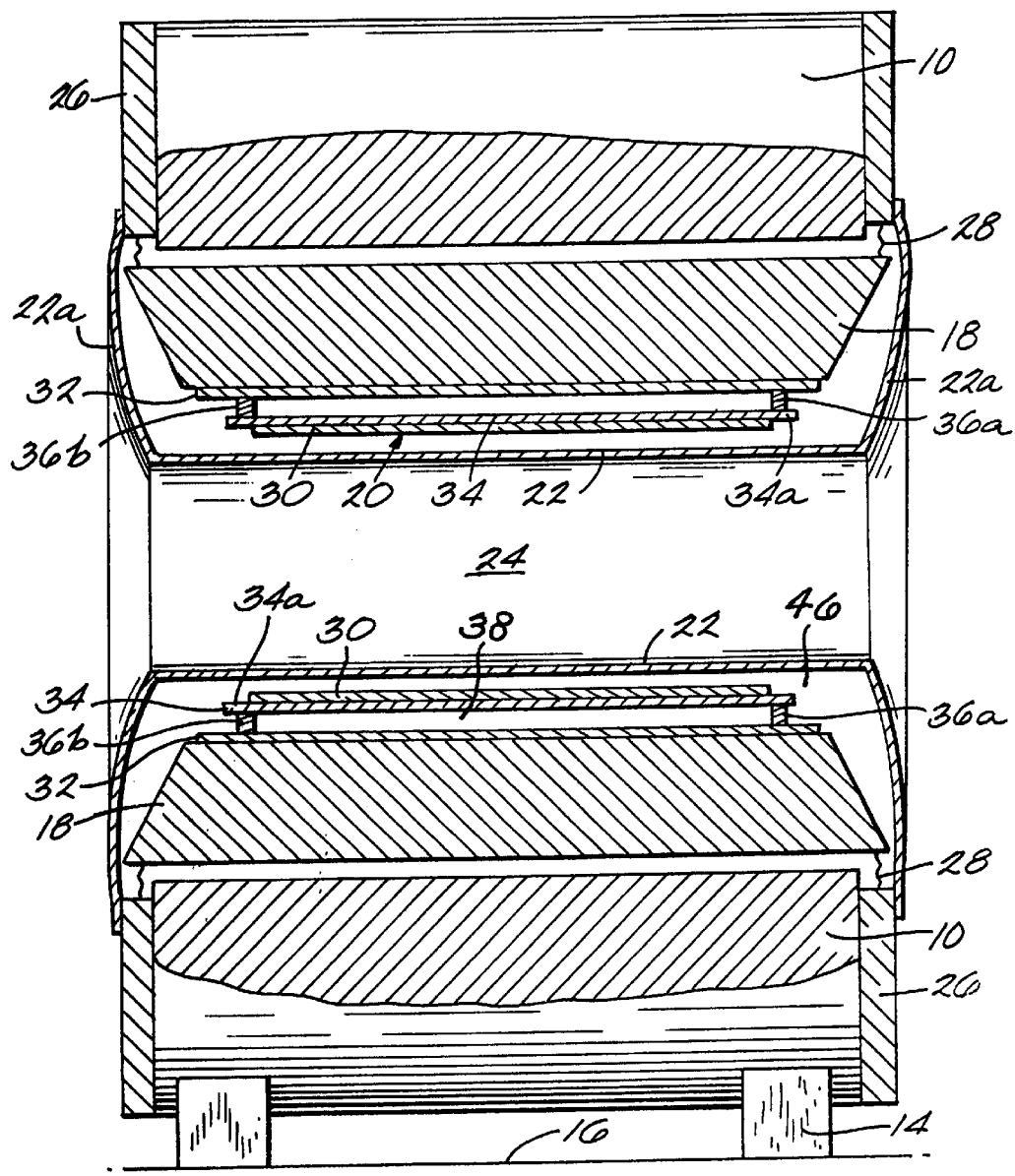
FIG. 2 is a sectional view taken along lines 2—2 of FIG. 1 which shows an embodiment of the invention in association with components depicted in FIG. 1.

FIG. 1 further shows a cylindrical inner form 22, comprising a thin-walled tubular member, which is positioned within RF coil assembly 20 in spaced-apart coaxial relationship. Tubular member 22 is also positioned in coaxial relationship with gradient coil assembly 18 and with the bore 12 of main magnet 10. The space or volume within the tubular member 22 is sized to receive a patient or other subject of MR imaging (not shown). Thus, such volume comprises a patient bore or imaging volume 24, that is, the volume in which the $B_0$ magnetic field, the gradient magnetic fields and the RF signals collectively act to produce MR image data, in accordance with well known MR processes. Tubular member 22 is held in place by fixably attaching its end portions 22a to main magnet 10, such as by means of end caps 26. As best shown by FIG. 2, end portions 22a of tubular member 22 are usefully flared outwardly.

Figure 3:
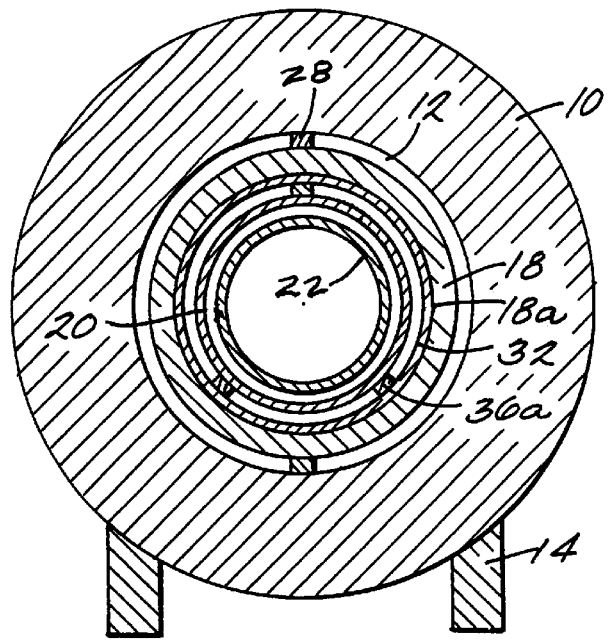
FIG. 3 is a sectional view taken along lines 3—3 of FIG. 1.

Referring to FIGS. 2 and 3 together, there is shown gradient coil assembly 18 supported upon main magnet 10, in spaced-apart relationship, by means of support elements 28. Elements 28 could comprise screws or the like. Alternatively, they could comprise structure which provides vibration isolation between gradient coil assembly 18 and main magnet 10. The support elements 28 align gradient coil assembly 18 within bore 12 so that the gradient coil assembly and the bore are in coaxial relationship. Gradient coil assembly 18 has a cylindrical inner wall 18a, and a sleeve member 32 is joined thereto.

As best shown by FIG. 2, RF coil assembly 20 comprises an RF coil 30 and an RF coil form 34. Coil form 34 comprises a hollow cylindrical structure formed of comparatively stiff material, such as fiber reinforced plastic (FRP), and has an inner surface 34a. The conductors of RF coil 30 are attached to coil form 34, suitable means, in close, adjacent relationship with inner surface 34a. RF coil 30 and coil form 34 are supported in bore 12 and within sleeve member 32 by means of screws 36a and 36b, which are respectively positioned at opposing ends of RF coil form 34. As described hereinafter in further detail, in connection with FIG. 4, each of the screws 36a and 36b extends between RF coil form 34 and sleeve member 32. The screws collectively hold RF coil assembly 20 in spaced-apart relationship with gradient coil assembly 18, to maintain an annular spacing 38 of specified width therebetween, as best shown by FIG. 3. FIG. 3 also illustrates that screws 36a and 36b preferably are grouped in sets, each comprising three screws, which are positioned around annular space 38 in equidistant relationship with one another. Thus, the three screws 36a shown in FIG. 3 are oriented at 120° from one another around annular space 38. Alternatively, other means besides screws 36a and 36b could be used to support RF coil 30 and RF coil form 34 in spaced-apart relationship with gradient coil assembly 18.

Referring further to FIG. 2, there is shown inner tubular member 22 supported by its flared ends 22a, and by end caps 26, so that it is in spaced-apart and noncontacting relationship with RF coil assembly 20. By providing such spatial separation between coil assembly 20 and the inner member 22, it has been found that mechanical motion of RF coil 30, resulting from induced eddy currents as described above, does not generate significant noise in imaging volume 24. Tubular member 22 is usefully formed of material such as FRP, which tends to act as a further barrier to the transmission of sound. Moreover, it is to be understood that gradient coil assembly 18 has a mass on the order of 2500 pounds, whereas RF coil assembly 20 has a mass on the order of 50 pounds. Accordingly, vibration or mechanical motion of RF coil 30 has little effect on gradient coil assembly 18, even if the RF coil assembly 20 is supportably carried on the gradient coil assembly 18, as described above in connection with FIGS. 2 and 3.

Figure 4:
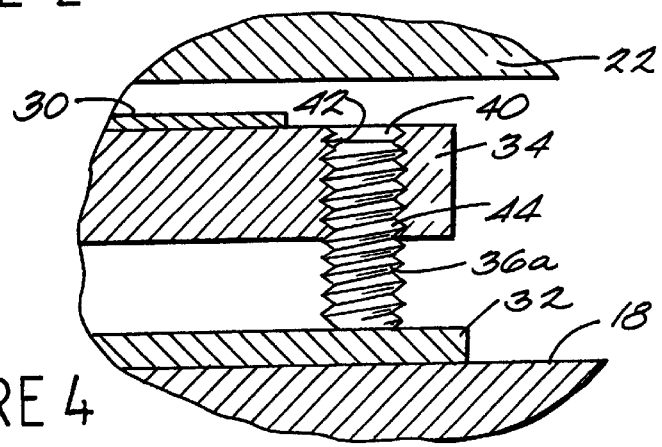
FIG. 4 is a view showing a portion of FIG. 2 in greater detail.

In an MR imaging system which includes the components described herein, RF coil assembly 20 must be disposed for easy insertion into, as well for as easy removal from, the magnet bore. This is necessary for initial setup, for periodic maintenance, and for other reasons. Accordingly, threaded holes are formed through RF coil form 34 to accommodate each of the screws 36a and 36b, the holes being located at the screw positions respectively described above in connection with FIGS. 2 and 3. Thus, as shown by FIG. 4, a hole 40 is provided with threads 42 which are sized to engage the threads 44 of one of the screws 36a. The screw may be engaged by a screwdriver or the like (not shown) through the end of hole 40 which is oriented away from gradient coil assembly 18. The engaged screw 36a may be rotated to advance the screw toward gradient coil assembly 18, and to thus bear against sleeve 32. The screw 36a may also be rotated in the opposite direction, to move the screw away from gradient coil assembly 18, when it is desired to remove the RF coil assembly 20 from the magnet bore.

Referring further to FIG. 2, there is shown gradient coil assembly 18 and RF coil assembly 20 contained within a space 46. Space 46 is enclosed by inner tubular member 22, end caps 26 and main magnet 10. In a modification of the invention, the structure surrounding space 46 is sealed to be made air-tight. Air is then evacuated from space 46, so that space 46 becomes a vacuum space. Such vacuum will further impede transmission of noise from the RF coil 30 to the inner tubular member 22 and to the imaging volume 24.

Figure 5:
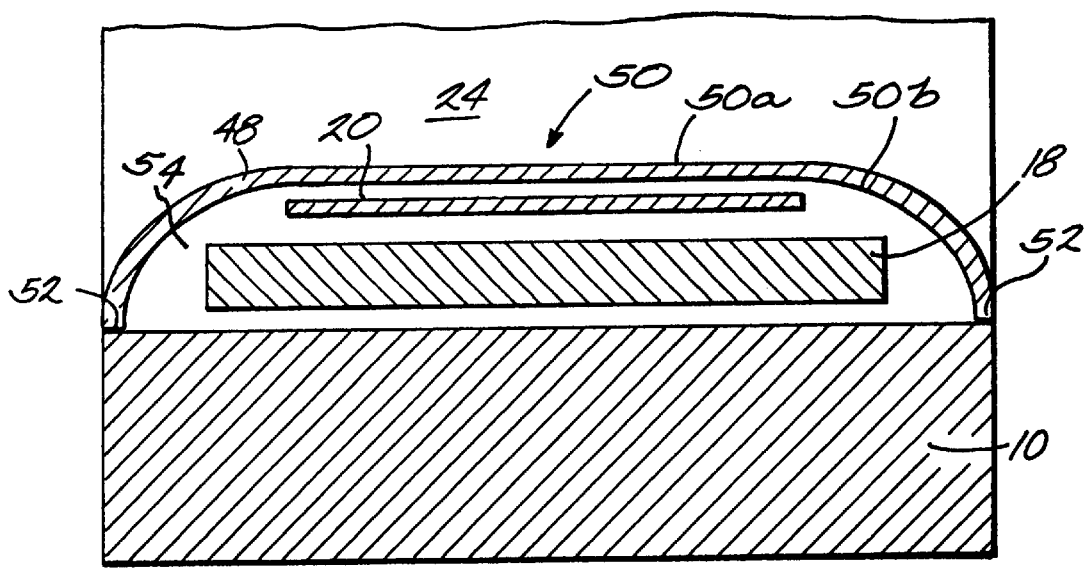
FIG. 5 is a sectional view showing a modification of the embodiment shown in FIG. 2.

Referring to FIG. 5, there is shown a further modification of the invention, wherein an inner tubular member 50 has been substituted for the tubular member 22. As stated above, tubular member 22 comprises a single wall. Tubular member 50 however, comprises two walls 50a and 50b, which are positioned in closely spaced parallel relation to provide a space 48 between them. Seals 52 are provided to sealably enclose the space 48, so that it is made air-tight. Also, air is removed or evacuated from space 48, so that it becomes a vacuum space. The vacuum space 48 serves as an excellent barrier against the transmission of noise from RF coil 30 to imaging volume 24. However, the vacuum space 48 is much smaller than the vacuum space 46 described above in connection with FIG. 2. The space 54 shown in FIG. 5, which lies within member 50 and surrounds the gradient and RF coil assemblies, may contain atmosphere or an inert gas. Use of inert gas could be particularly useful for the prevention of arcing within the space 54.

Obviously, many other modifications and variations of the present invention are possible in light of the above teachings. It is therefore to be understood that within the scope of the disclosed concept, the invention may be practiced otherwise than as has been specifically described.

What is claimed is:

1. RF coil apparatus for an MR imaging system, wherein said system is provided with a main magnet having a bore and with a gradient coil assembly having an inner wall and located within said bore, said RF coil apparatus comprising:
a tublar RF coil form provided with an inner surface;
an RF coil attached to said RF coil form, in adjacent relationship with said RF coil form inner surface;
mounting structure extending between said RF coil form and said inner wall of said gradient coil assembly whereby said RF coil and said RF coil form are supported by said gradient coil assembly;
an inner tubular member; and
means for supporting said inner tubular member within said bore whereby said tubular member is positioned in selected spaced-apart relationship with said RF coil and said RF coil form, and whereby said inner tubular member defines a specified portion of the volumen of said bore, said specified portion comprising an MR imaging volume.

2. The apparatus of claim 1 wherein:
said RF coil form and said RF coil attached thereto collectively comprise an RF coil assembly; and
said inner tubular member is selectively constructed to oppose transmission of acoustic signals from said RF coil assembly to said imaging volume.

3. The apparatus of claim 2 wherein:
said mounting structure is disposed to support said RF coil assembly in selected spaced-apart relationship with said inner wall of said gradient coil assembly.

4. The apparatus of claim 3 wherein said mounting structure comprises:
a sleeve member joined to said inner wall of said gradient coil assembly; and
a plurality of adjustable screws extending between said sleeve member and said RF coil form.

5. The apparatus of claim 4 wherein:
three of said adjustable screws are positioned around an annular space located between said sleeve member and said RF coil form, in substantially equidistant relationship with one another.

6. The apparatus of claim 3 wherein:
said inner tubular member is provided with two closely-spaced walls which are respectively sealed to maintain a vacuum space between said RF coil assembly and said imaging volume.

7. The apparatus of claim 3 wherein:
said inner tubular member comprises a thin wall of selected acoustic insulating material.

8. The apparatus of claim 3 wherein:
said inner tubular member comprises a thin wall of selected material, which is sealed to maintain a vacuum space in a region surrounding said RF coil assembly.

9. Apparatus for an MR imaging system provided with a main magnet having a bore, said apparatus comprising:
a gradient coil assembly comprising a hollow cylindirical member;
an RF coil form comprising a hollow cylindrical member having an outside diameter which is selectively less than the inside diameter of said gradient coil assembly;
an RF coil attached to said RF coil form along the inside diameter of said RF coil form;
mean for supporting said RF coil form and said RF coil within said gradient coil assembly, and in space-apart relationship therewith; and
an inner tubular member supported within said RF coil form whereby said tubular member is positioned in selected spaced-apart relationship with said RF coil and said RF coil form, and whereby said inner tubular member defines a specified portion of the volume of said bore, said specified portion comprising an MR imaging volume for said MR imaging system.

10. The apparatus of claim 9 wherein:
said inner tubular member is selectively constructed to oppose transmission of acoustic signals from said RF coil and said RF coil form to said imaging volume.

11. The apparatus of claim 10 wherein said means for fixably supporting said RF coil form and said RF coil comprises:
a sleeve member joined to said gradient coil assembly; and
a plurality of adjustable screws extending between said sleeve member and said RF coil form.

12. The apparatus of claim 10 wherein:
three of said adjustable screws are positioned around an annular space located between said sleeve member and said RF coil form, in substantially equidistant relationship with one another.

13. The apparatus of claim 10 wherein:
said inner tubular member is provided with two closely-spaced walls which are respectively sealed to maintain a vacuum space between said RF coil and said imaging volume.

14. The apparatus of claim 10 wherein:
said inner tubular member comprises a thin wall of selected acoustic insulating material.

15. In an MR imaging system provided with a main magnet having a bore, gradient coil assembly located within the bore, and an inner tubular member likewise located within the bore to define a specified portion of the bore which comprises a MR imaging volume, RF coil apparatus comprising:
a tubular RF coil form provided with an inner surface;
an RF coil attached to said RF coil form, in adjacent relationship with said RF coil form inner surface; and
means for supporting said RF coil and RF coil form upon said gradient coil assembly, in selected spaced-apart relationship therewith and also in selected spaced-apart relationship with said inner tubular member.

16. The apparatus of claim 15 wherein said means for fixably supporting said RF coil form and said RF coil comprises:
a sleeve member joined to said gradient coil assembly; and
a plurality of adjustable screws extending between said sleeve member and said RF coil form.

17. The apparatus of claim 16 wherein:
three of said adjustable screws are positioned around an annular space located between said sleeve member and said RF coil form, in substantially equidistant relationship with one another.

* * * * *